(12) United States Patent
Haba et al.

(10) Patent No.: US 7,989,940 B2
(45) Date of Patent: Aug. 2, 2011

(54) SYSTEM AND METHOD FOR INCREASING THE NUMBER OF IO-S ON A BALL GRID PACKAGE BY WIRE BOND STACKING OF SAME SIZE PACKAGES THROUGH APERTURES

(75) Inventors: Belgacem Haba, San Jose, CA (US); Masud Beroz, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 24 days.

(21) Appl. No.: 11/014,506

(22) Filed: Dec. 15, 2004

(65) Prior Publication Data

US 2005/0133899 A1 Jun. 23, 2005

Related U.S. Application Data

(60) Provisional application No. 60/531,032, filed on Dec. 19, 2003.

(51) Int. Cl.
*H01L 23/02* (2006.01)

(52) U.S. Cl. ........ 257/686; 257/783; 257/782; 257/678; 257/774; 257/684; 257/690; 257/E25.023

(58) Field of Classification Search .................. 257/686, 257/783, 782, 678, 774, 684, 690, E25.023
See application file for complete search history.

(56) References Cited

U.S. PATENT DOCUMENTS

| | | | |
|---|---|---|---|
| 4,996,587 A | 2/1991 | Hinrichsmeyer et al. | |
| 5,373,189 A * | 12/1994 | Massit et al. | 257/686 |
| 5,422,435 A * | 6/1995 | Takiar et al. | 257/686 |
| 5,679,977 A | 10/1997 | Khandros et al. | |
| 5,870,289 A * | 2/1999 | Tokuda et al. | 361/779 |
| 5,903,049 A * | 5/1999 | Mori | 257/686 |
| 6,180,881 B1 * | 1/2001 | Isaak | 174/524 |
| 7,180,312 B2 * | 2/2007 | Arisaka et al. | 324/754 |
| 2003/0162326 A1 * | 8/2003 | Tsubosaki et al. | 438/109 |

* cited by examiner

*Primary Examiner* — Junghwa M Im
(74) *Attorney, Agent, or Firm* — Lerner, David, Littenberg, Krumholz & Mentlik, LLP

(57) ABSTRACT

A multi-layer electronic package having polymeric tape layers, where at least one of the polymeric tape layers has a via, through hole, or aperture therein to pass wiring between the layers. This enables a balance of package size, adhesive thickness, chip access, inventory management, package width, JEDEC ball out, and die exposure. The polymeric tape layers have surface circuits (e.g., leads, pads, and wiring) located on the surface.

10 Claims, 9 Drawing Sheets

FIG. 1A
(PRIOR ART)

STACKING OF DIE OF DIFFERENT SIZES

FIG. 1B
(PRIOR ART)

STACKING OF DIE OF SAME SIZES

FIG. 1C
(PRIOR ART)

STACKING OF PACKAGES OF DIFFERENT SIZES

FIG. 1D
(PRIOR ART)

STACKING OF PACKAGES OF SAME SIZES

STACKING OF PACKAGES OF SAME SIZES USING SOLDER BALL

SYSTEM AND METHOD FOR INCREASING THE NUMBER OF IO-S ON A BALL GRID PACKAGE BY WIRE BOND STACKING OF SAME SIZE PACKAGES THROUGH APERTURES

PRIOR APPLICATION

This application claims priority from U.S. Provisional Patent Application No. 60/531,032 filed Dec. 19, 2003.

BACKGROUND

In conventional stacked chip packaging systems and methods, a great deal of effort and cost is expended in connecting one layer to another and to an outside connection.

FIG. 1 illustrates a conventional approach to configuring die and packages with wire bond in both same size packages and different size packages. FIGS. 1A and 1C illustrate different size die (FIG. 1A) and packages (FIG. 1C), where the stacking is on a stair case shape. In each package, connections must be made on the outside of the die edges, or otherwise made through the die substrates. FIGS. 1B and 1D illustrate equal size die (FIG. 1B) and packages (FIG. 1D), where the stacking is on a rectangular configuration. Like the other package configurations illustrated in FIGS. 1A and 1C, in each package, connections must be made on the outside of the die edges, or otherwise made through the die substrates. In an assembly of the same size packages, a thick adhesive is used to clear the wire bond loop.

Figure 1A:
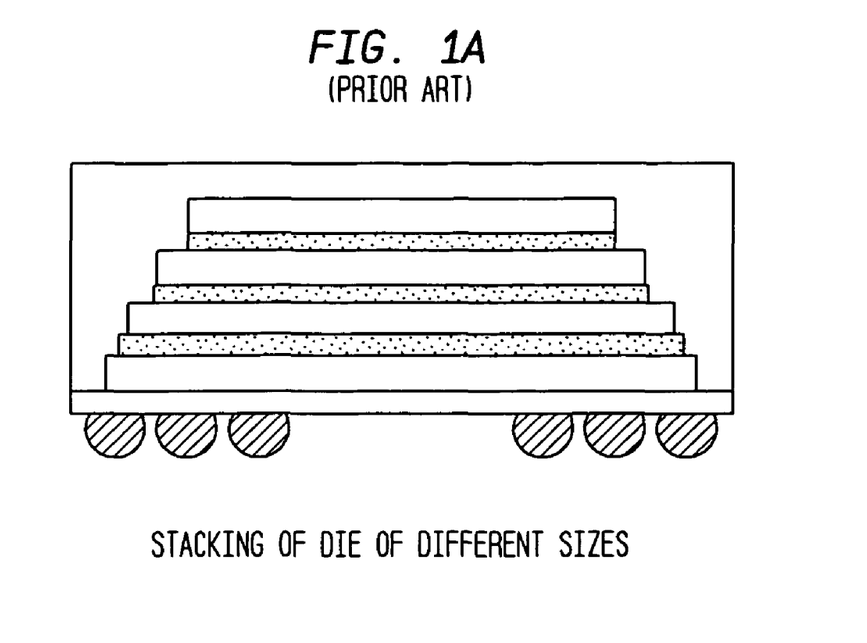
Figure 1B:
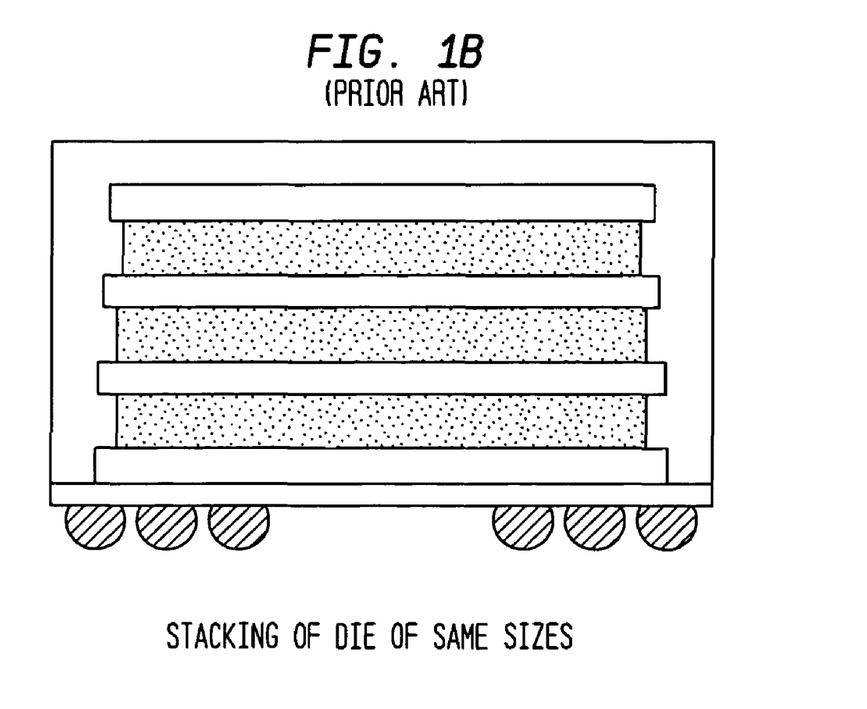
Figure 1C:
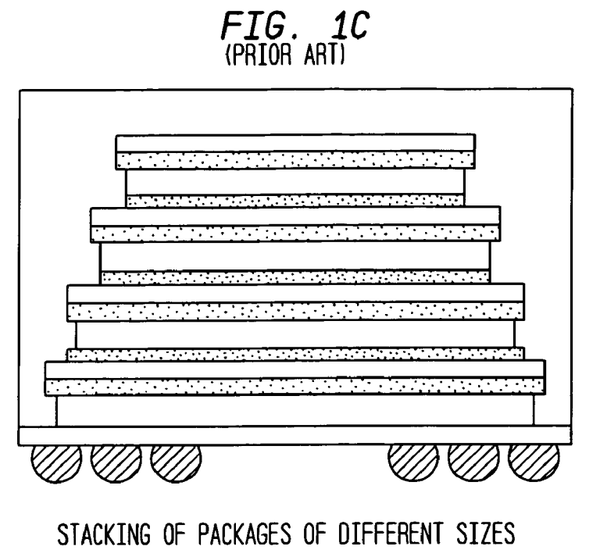
Figure 1D:
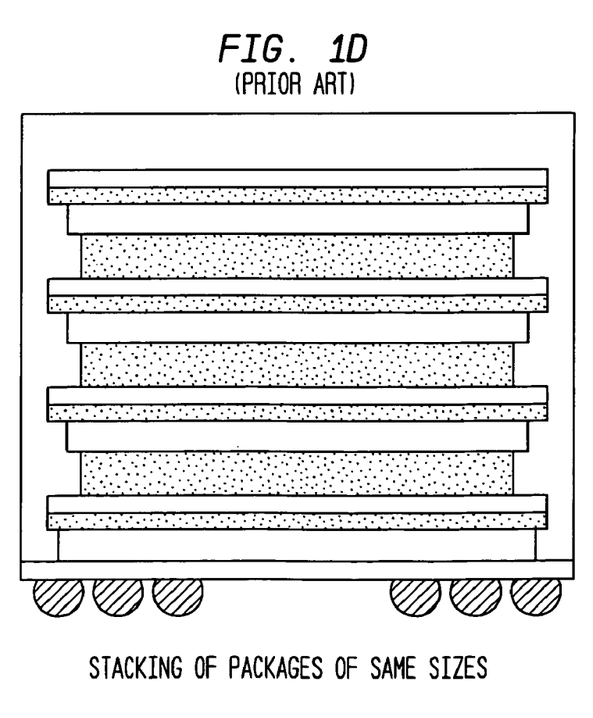
Figure 2A:
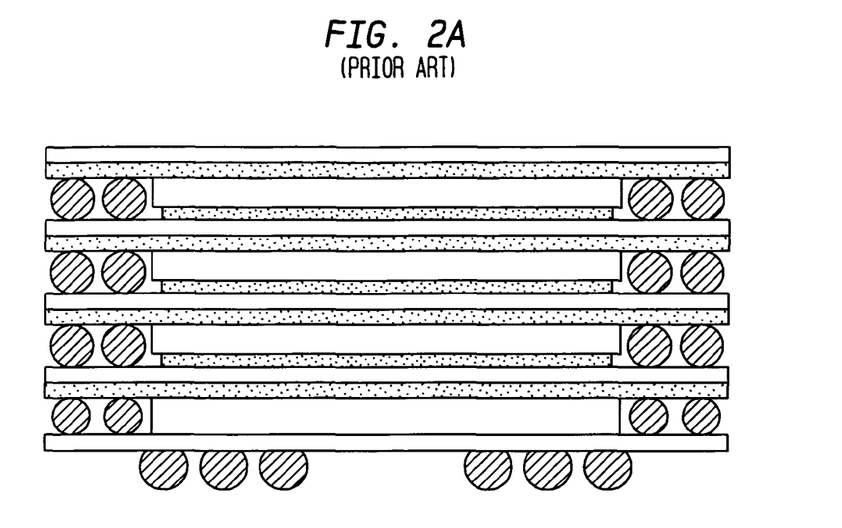
Figure 2B:
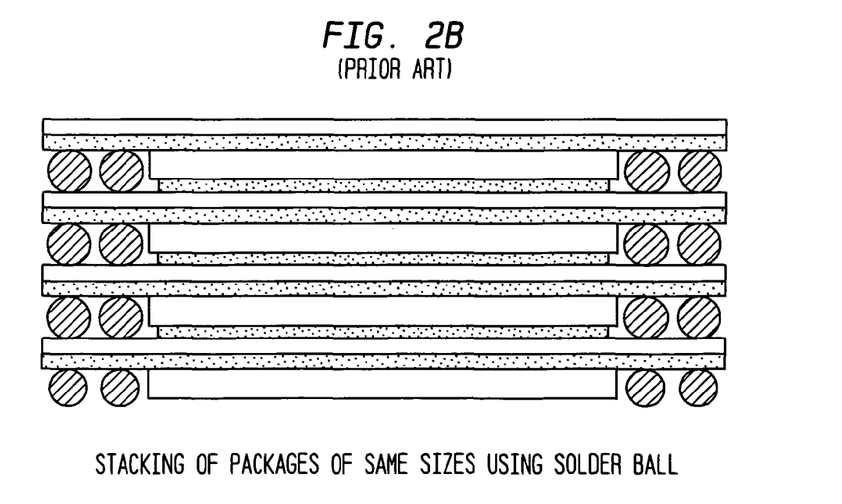

Referring to FIG. 2, a stacked chip package is illustrated having solder balls in between same sized stacked layers of the package. In processing such a package, wide variations in temperature greatly affect the ability to stack and connect the different layers. Also, the connections are difficult to make from layer to layer, and are done upon processing and assembly of the package.

Table 1 compares and contrasts the features and benefits of three exemplary ways of stacking, i.e., solder ball stacking of equal sized packages, wire bond stacking of equal size packages, and wire bond stacking of different size packages. The configurations are compared in terms of adhesive thickness, individual chip select, inventory management, package width, JEDEC ball out, and whether or not the die is exposed.

TABLE 1

| | Reported package stacking | | |
| --- | --- | --- | --- |
| | Solder ball stacking | Wire bond stacking | |
| Package size | Same | Same | Different |
| Adhesive (total package thickness) | THIN | THICK | THIN |
| Chip select required in individual package | YES | NO | NO |
| Inventory issue | YES | NO | YES |
| Package width | WIDE | NARROW | NARROW |
| JEDEC ball out | NO | YES | YES |
| Exposed die | YES | NO | NO |

The comparison shows the need for a multi-level packaging strategy that optimizes the trade-off between package size, adhesive thickness, chip access, inventory management, package width, JEDEC ball out, and dies exposure. As will be seen, the invention optimizes these features in an elegant manner.

SUMMARY OF THE INVENTION

This balance of package size, adhesive thickness, chip access, inventory management, package width, JEDEC ball out, and die exposure is accomplished in a microelectronic circuit package having a stacked array of a plurality of polymer tape elements. The polymer tape elements have surface circuitization (e.g., leads, pads, and wiring) located on the surface. At least one of the polymer tape elements has a via or opening therein to pass wiring between elements within the periphery of the package.

This balance of package size, adhesive thickness, chip access, inventory management, package width, JEDEC ball out, and die exposure is also accomplished in a microelectronic circuit package having a stacked array of polymer tape elements. The polymer tape elements are in stacked array one above another, where the polymer tape elements have surface circuitization. At least one of the polymer tape elements has a via therein. By this expedient the package circuitization includes leads from a polymer tape element having the via therein to a next subjacent or superjacent polymer tape element.

BRIEF DESCRIPTION OF THE DRAWINGS

FIG. 1 including FIGS. 1A, 1B, 1C, and 1D, denominated "Prior Art" illustrate exemplifications of multi-die and multi-package configurations including wiring interconnections.

FIG. 2, including FIGS. 2A and 2B, denominated "Prior Art" illustrate exemplifications of multi-die and multi-package configurations including wiring interconnections.

FIG. 3, including

FIG. 4, including

DESCRIPTION OF THE INVENTION

The microelectronic package configuration and the exemplary microelectronic packages described herein provide a multi-layer package that balances the competing demands of package size, adhesive thickness, chip access, inventory management, package width, JEDEC ball out, and die exposure. This is accomplished in a microelectronic circuit package having a stacked array of polymer tape elements. The polymer tape elements are in stacked array one above another. The individual polymer tape elements have surface circuitization. Intra-package connectivity is provided by routing some circuitization through an aperture, in the sense of a via or through hole, in at least one of the individual polymeric elements. By this expedient the package circuitization routes circuitization from one polymeric tape element having a via therein to circuitization on another polymeric element, for example, to a next subjacent or superjacent polymeric tape element. The aperture, as a window, exposes pads or other contacts of the packages below. This technique enables wire bonding in all packages from both edges of the die, while avoiding wire bonding outside the periphery of the package. Furthermore, the connections can be made through the apertures after assembly, allowing for variations in connections from one layer to another to provide further flexibility in design.

The package described herein is an assembly of TAB (Tape Automated Bonding) packages. A TAB tape known in the art comprises an electrically insulating base film, such as polyimide, having a conductor pattern formed on the base film. One advantage of a TAB tape is that it can provide an extremely fine conductor pattern.

For producing a TAB tape, the circuitization is fabricated by forming a conductive film, for example, copper foil and the like on polymer film and then etching the circuitization pattern in the film in the shape of a required pattern. One advantage of TAB bonding is that the conductor thin film is supported on the polymeric base film of the TAB tape, and it therefore becomes possible to use a conductor which is much thinner than a conventional metal lead frame and to form a conductor pattern of high-density which cannot be formed by such a conventional metal lead frame.

Because the base film of the TAB tape supports the circuitization conductor pattern, the polymeric base film itself must have a low dielectric coefficient and low conductivity. In addition, this base film must be thermally rugged to withstand fabrication, since the TAB tape is hermetically sealed with resin after a semiconductor chip is mounted on thereon. Thus, a heat-resisting plastic film such as polyimide film or the like is used as the base film.

A conventional semiconductor device with a TAB tape includes the TAB tape and a semiconductor element or die. The TAB tape is formed of an insulating organic polymer such as a polyimide film which has a frame-like shape. Generally, the polymeric film is rectangular in shape, and has an uncircuitized rectangular area for attachment of the semiconductor device. A plurality of electrodes are arranged on the semiconductor device in a line along four sides thereof.

The TAB element carries a plurality of signal lines and ground lines on the polymeric TAB element. These lines are formed, for instance, by depositing a thin metallic film such as a copper film on the polymeric element and wet-etching, dry etching, or ion beam etching the thin metallic film. The signal and ground lines typically extend inwardly from the film to electrically connect with the semiconductor electrodes. In addition, the signal and ground circuitization extend outwardly beyond the TAB element. When the semiconductor device is to be mounted on a circuit board or card, the signal and ground extending outwardly from the semiconductor device are electrically connected to electrodes formed on board, card, or panel.

Figure 3A:
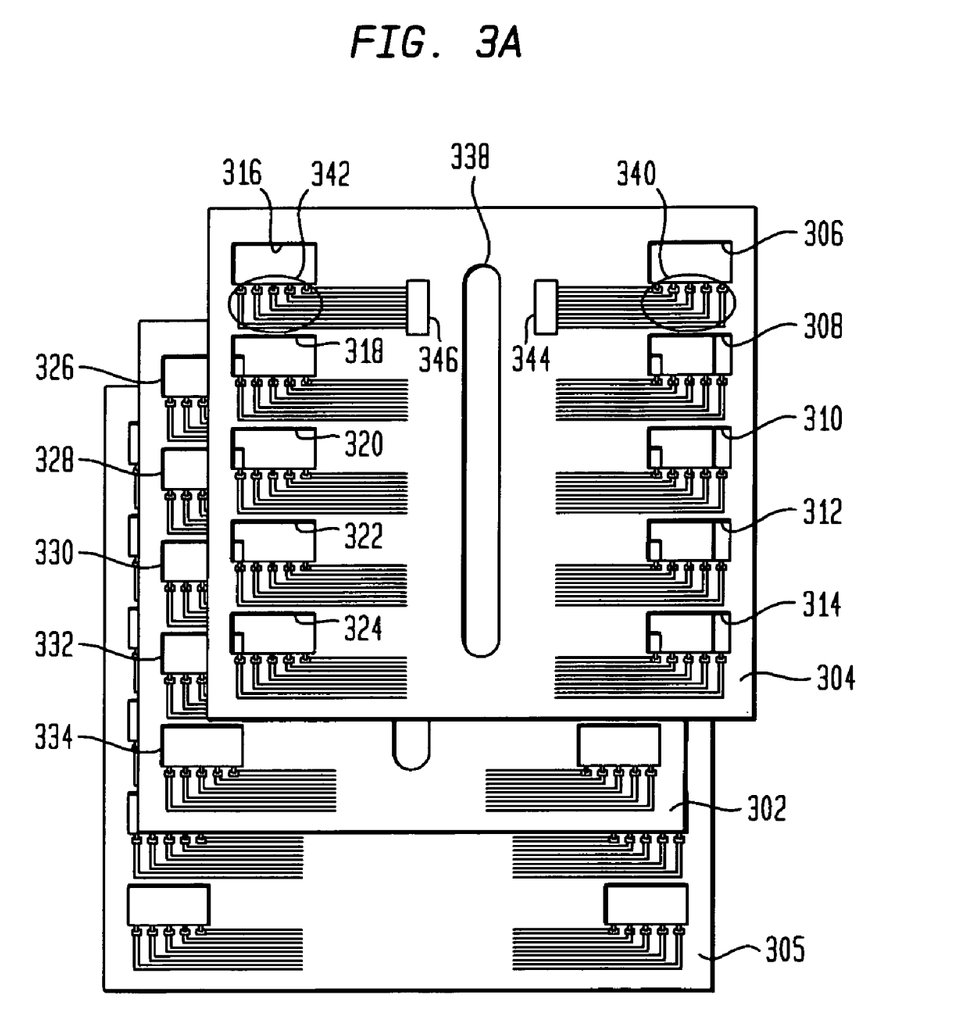
FIGS. 3A, 3B, and 3C, illustrates one exemplification of our invention of a stacked array of polymer tape elements having the die in a face up configuration.
Figure 3B:
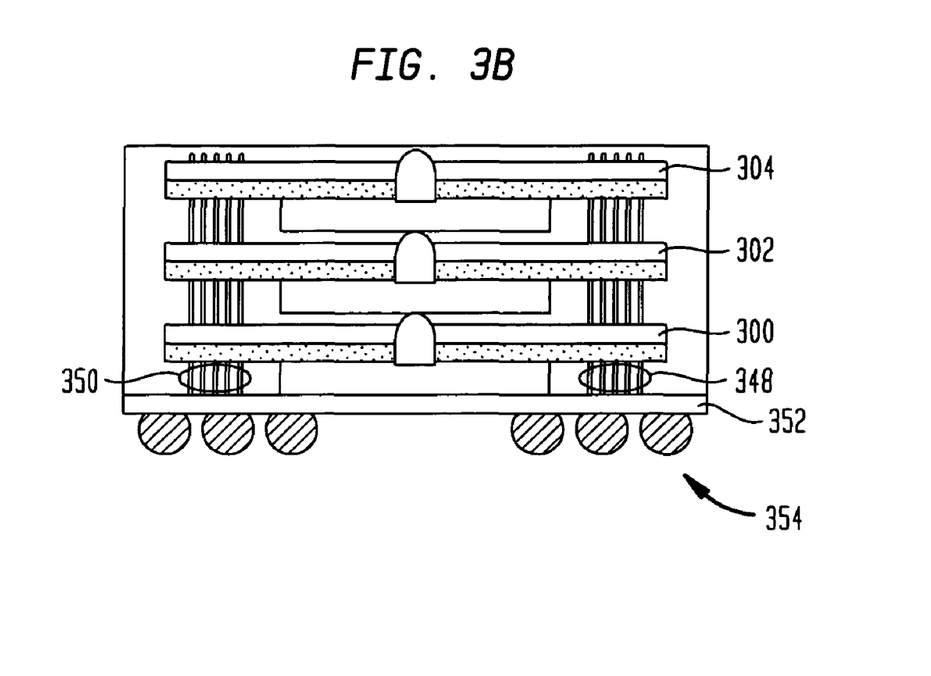
Figure 3C:
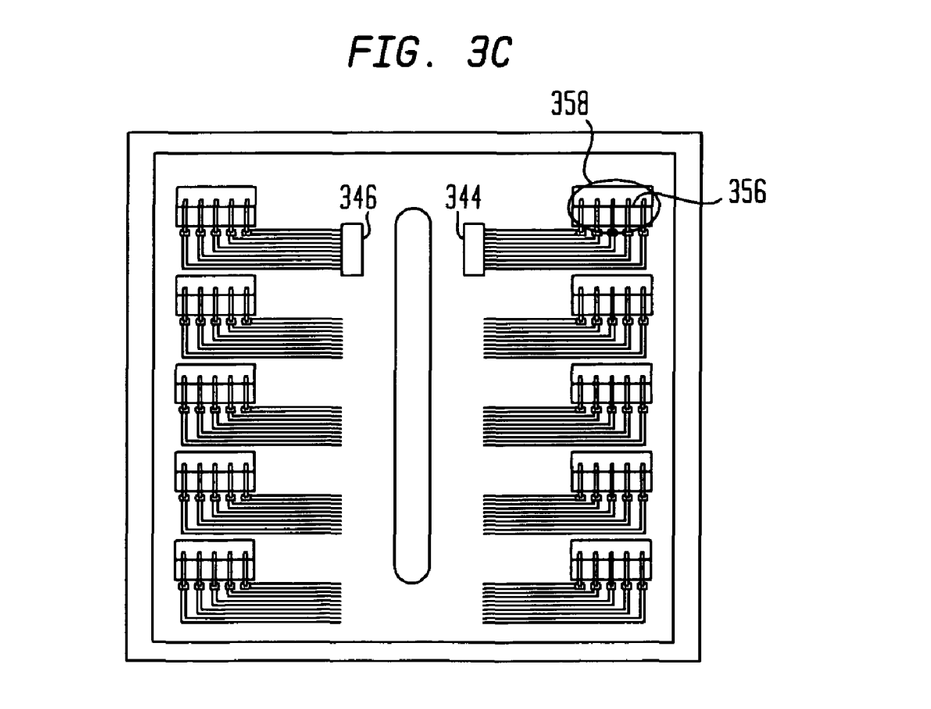

According to the invention, wire connections can be carried from one TAB element to another via apertures located on each tab. Referring to FIGS. 3A, 3B, and 3C, one embodiment of the invention is illustrated in an application where TABs are arrayed in a Ball Grid Array ("BGA") in a "face up" configuration. Referring first to FIG. 3A, an exploded above view is shown of a package including a plurality of TAB 302, 304, 305, elements, where the elements include apertures 306-334 substantially along the centerline 338 thereof. The apertures are configured to carry wiring connected to electrical connections 340, 342, from semiconductor elements 344, 346 mounted on a TAB element 304 to lower elements 302, 305 or to a printed circuit board, card, or panel. FIG. 3B shows a side view of an assembled package with tabs 302, 304, 305, stacked. Wires 348, 350 may extend from one TAB element to the next, or may skip from a top TAB element 304 directly to the other TAB elements, or to substrate 352 to connect to solder balls 354. Referring to FIG. 3C, a top view of the package of FIG. 3B is shown, illustrating the wire connections 356 emanating from orifice 358 on the top of the package and connecting to semiconductor elements 344, 346. Thus, the invention provides a means to freely connect from TAB to TAB and to the substrate of the package without the need for complicated interconnections among the TABs as in conventional methods and systems.

Figure 4A:
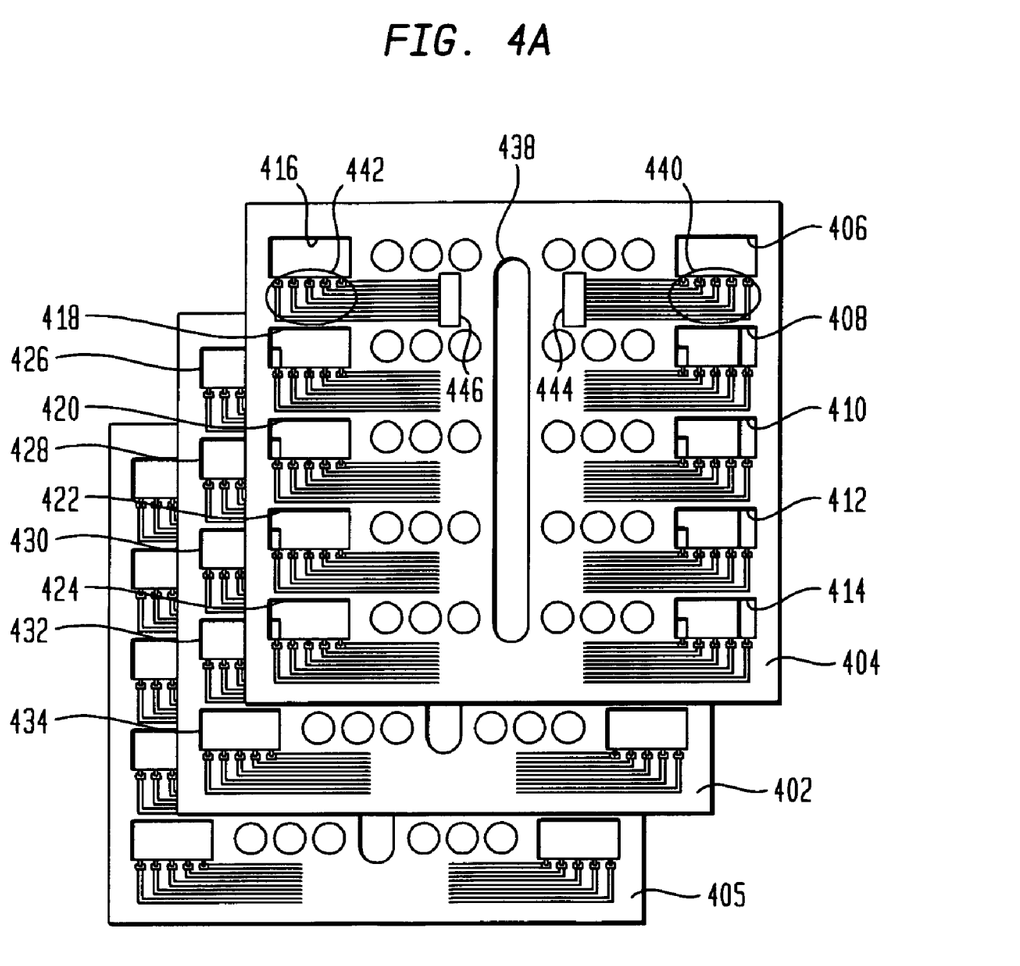
FIGS. 4A, 4B, and 4C, illustrates one exemplification of our invention of a stacked array of polymer tape elements having the die in a face down configuration.
Figure 4B:
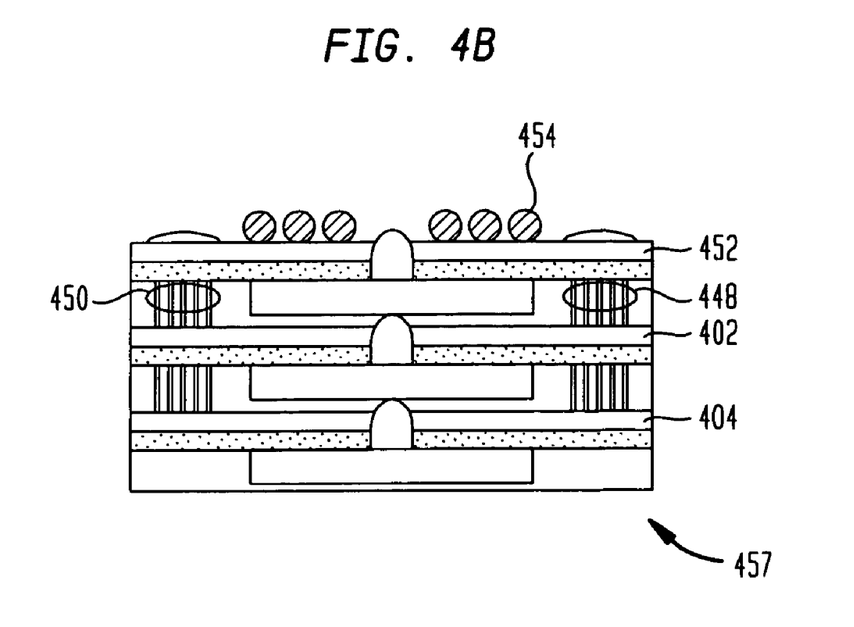
Figure 4C:
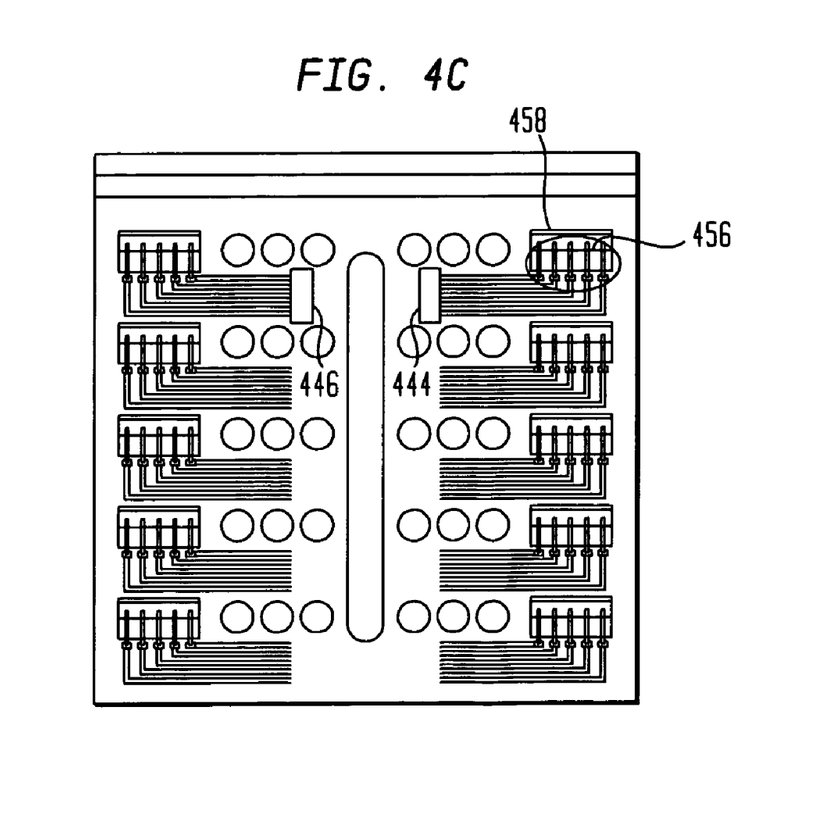

According to the invention, wire connections can be carried from one TAB element to another via apertures located on each tab. Referring to FIGS. 4A, 4B, and 4C, one embodiment of the invention is illustrated in an application where TABs are arrayed in a Ball Grid Array ("BGA") in a "face down" configuration. Referring first to FIG. 4A, an exploded above view is shown of a package including a plurality of TAB 402, 404, 405, elements, where the elements include apertures 406-434 substantially along the centerline 438 thereof. The apertures are configured to carry wiring connected to electrical connections 440, 442, from semiconductor elements 444, 446 mounted on a TAB element 404 to lower elements 402, 405 or to a printed circuit board, card, or panel. FIG. 4B shows a side view of an assembled package with tabs 402, 404, 405, stacked. Wires 448, 450 may extend from one TAB element to the next, or may skip from a top TAB element 404 directly to the other TAB elements, or to substrate 452 to connect to solder balls 454. Referring to FIG. 4C, a view of the package from the bottom surface side 457 of FIG. 4B is shown, illustrating the wire connections 456 emanating from orifice 458 on the top of the package and connecting to semiconductor elements 444, 446. Thus, the invention provides a means to freely connect from TAB to TAB and to the substrate of the package without the need for complicated interconnections among the TABs as in conventional methods and systems.

The final package can be in face-up BGA type as illustrated in FIG. 3, or in a face-down BGA as in FIG. 4. Additionally, each package can be a JEDEC standard ball-out design. In FIGS. 3 and 4 the aperture was shown to be a single aperture normal to center pad axis of the die. However, this is only illustrative, and those skilled in the art will understand that there could be multiple apertures that could be arrayed at an arbitrary alignment. Openings could be slanted at any angle to accommodate different configurations. The exception may be openings that are parallel to the die center pad axis, which makes it difficult to perform wire bond processes.

Figure 5A:
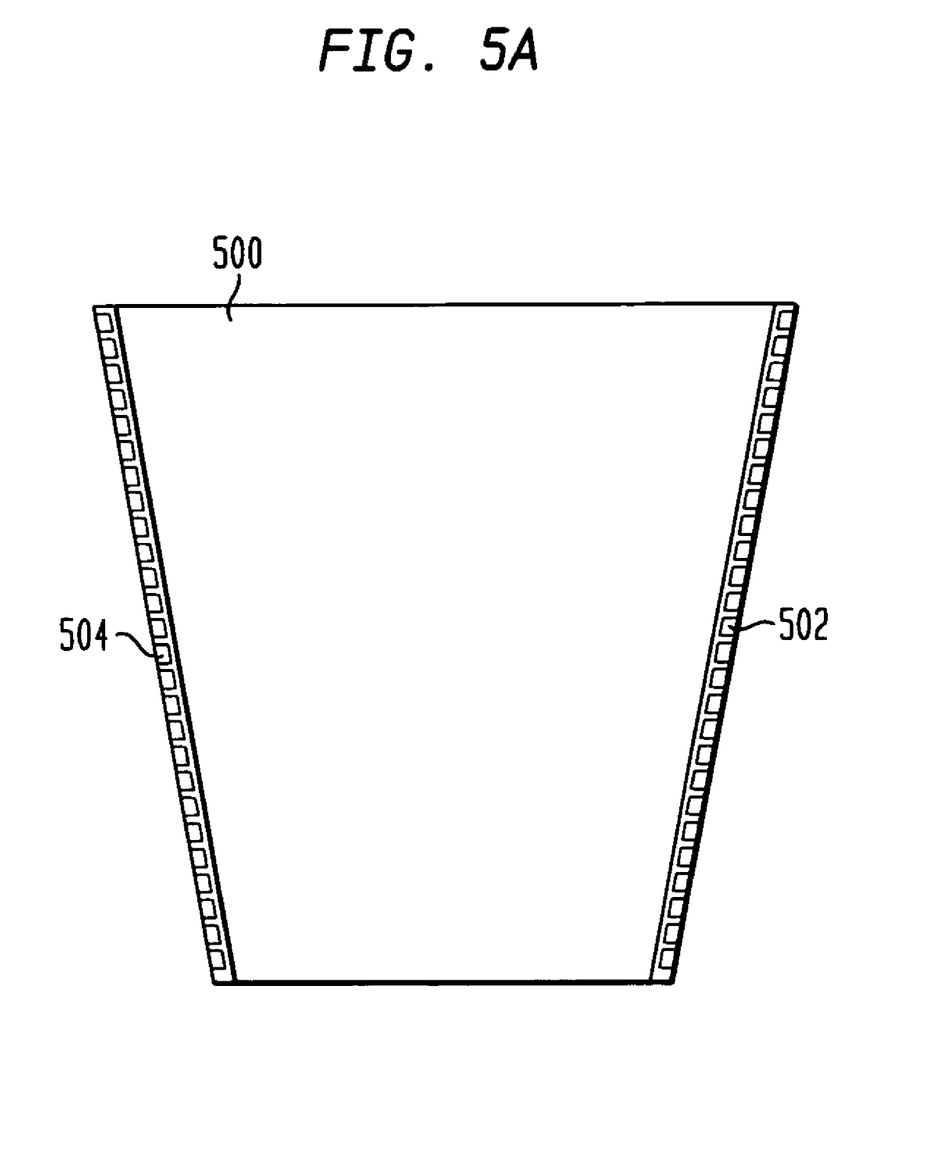
FIG. 5 illustrates another embodiment of the invention that maximizes electrical contacts in a chip package.
Figure 5B:
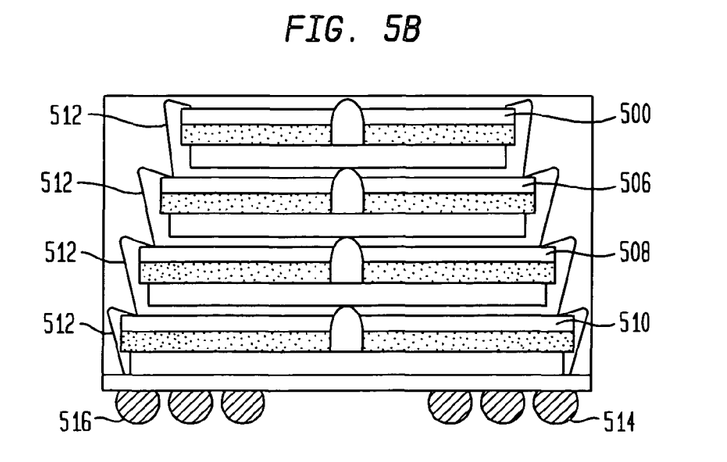

Referring to FIG. 5, another embodiment of the invention is illustrated, where the contacts locate on the edges of the multiple layered dies are overlapped in a reverse fashion in comparison to the openings of the embodiments illustrated in FIGS. 3 and 4 and discussed above. FIG. 5a, a substrate 500 is illustrated in a trapezoidal shape, having rows of electrical contacts 502, 504. The configuration is adaptable to stacked substrates that may be either skewed or of various sizes to expose the electrical contacts for connection. Contacts can be set on two sides of a substrate, and modifying the shape of the substrates to maximize the edge length would increase the number of contacts on each utilized edge. Similarly, and referring back to the configurations illustrated in FIGS. 3 and 4, if the openings were configured as trapezoids or other shape that optimizes the edges on which the contacts are located, then the number of contacts can be maximized. Referring to FIG. 5B, a chip package 505 of stacked substrates 500, 506, 508, and 510 is illustrated. The substrates are illustrated stacked in a skewed or otherwise offset manner in order to allow vertical access to the contact edges, such as 502 and 504, so that processing is convenient.

In fabrication, it is important to allow contact with the electrical contacts located on the edges of the substrate, so that conventional processing equipment can make connections with contacts with wires or other electrical contact means. According to the invention, whether the contacts occur on the inside edge of an orifice or on a maximized contact edge, increased contact edges are achieved, and thus more contacts.

Figure 5C:
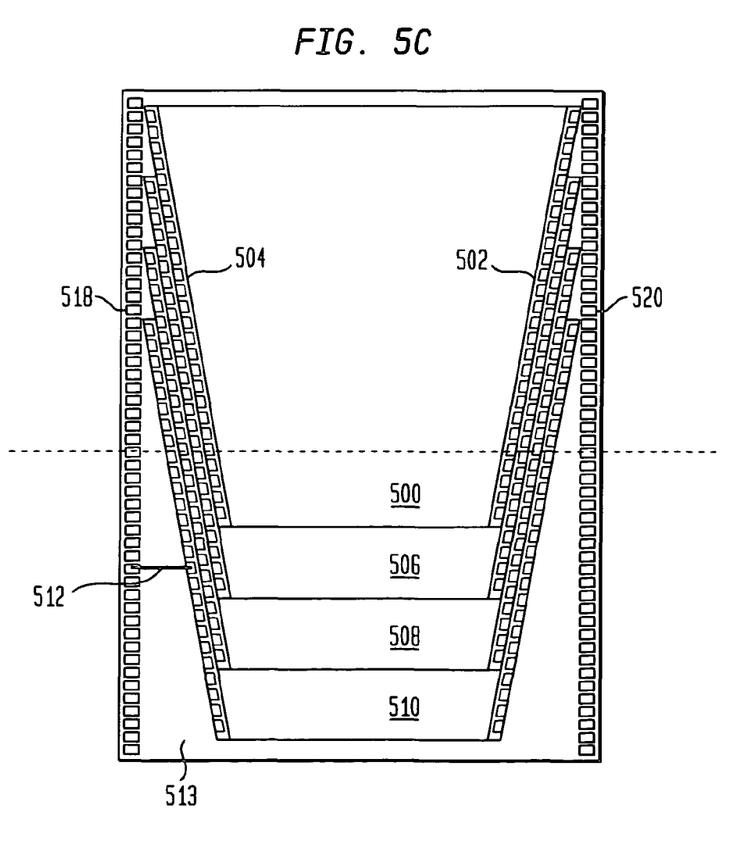

Still referring to FIG. 5B, contact wires 512 connect contacts from one substrate layer to the next, and ultimately to down to a base substrate 513, through which solder balls 514, 516 can be contacted. Once the package is mounted on a printed wiring board (PWB), the solder balls are placed into contact with outside devices. Referring to FIG. 5C, a top view of the package of 5B is illustrated showing the access to the edge contacts 502 and 504, as well as all other edges of the four substrates 500, 506, 508 and 510. The base substrate 513 is illustrated with edge contacts 518, 520 that have a few wires 512 for illustration of contacting the edges of the several substrates and the base substrate.

While the foregoing description has been with reference to particular embodiments of the invention, it will be appreciated that these are only illustrative of the invention and the changes may be made to those embodiments without departing from the principles of invention, the scope of which is defined by the appended claims.

We claim:

1. A microelectronic circuit package, comprising:
   first and second polymer tape elements in stacked array;
   a plurality of microelectronic elements attached to respective ones of said polymer tape elements, said polymer tape elements having contacts located on a first surface, at least one of said polymer tape elements having an aperture therein,
   a bonding wire extending through the aperture, the bonding wire connecting one of said contacts located on one surface of the first polymer tape element to another one of said contacts located on a surface of the second polymer tape element, and
   a resin sealing therein the first and second polymer tape elements, the plurality of microelectronic elements attached thereto, and the bonding wire; and
   a ball grid array exposed at a surface of said package for providing electrical interconnection to at least said first and second polymer tape elements.

2. The microelectronic circuit package of claim 1, further comprising any number of additional polymer tape elements in said stacked array.

3. The microelectronic circuit package of claim 2, further comprising a second bonding wire connecting one of said contacts located on one surface of the first polymer tape element to another one of said contacts located on a surface of such additional polymer tape element.

4. A microelectronic circuit package, comprising:
   a plurality of polymer tape elements in stacked array,
   said polymer tape elements having contacts located on a first surface,
   at least one of said polymer tape elements having an aperture therein,
   the package further comprising bonding wires extending through the aperture, the bonding wire connecting one of said contacts located on one surface of one of the polymer tape elements to a connection outside the package,
   a resin sealing therein the first and second polymer tape elements, and the plurality of microelectronic elements attached thereto; and
   a ball grid array exposed at a surface of said package for providing electrical interconnection to at least said first and second polymer tape elements.

5. The microelectronic circuit package of claim 2, wherein the additional polymer tape elements are disposed at least one of above or below at least one of said first and second polymer tape elements and the bonding wires connecting one of said contacts located on the surface of at least one of the first or second polymer tape elements connect to at least one of the additional polymer tape elements.

6. The microelectronic circuit package of claim 5, wherein the wire bonds connected to the at least one additional polymer tape elements bypasses at least one other of the additional polymer tape elements.

7. the microelectronic circuit package of claim 4, further comprising a second bonding wire connecting one of said contacts located on one surface of one of the polymer tape elements to another one of said contacts located on a surface of another one of the polymer tape elements.

8. A microelectronic circuit package, comprising:
   a first and second polymer tape elements having contacts located on at least one surface,
   the polymer tape elements being substantially a same size and each being trapezoidal, having a first edge and an opposing second edge and a third edge between the first and second edges, wherein the first edge and second edge extend toward a point of convergence substantially opposite the third edge, and the first polymer tape elements is stacked above the second polymer tape element at a skew, so that the point of convergence of the first polymer tape element is displaced towards the third edge of the second polymer tape, to expose edge connections along the first edge and the second edge of the second polymer tape element; and
   a first electrical connection connecting a first contact located on the first edge of the first polymer tape element to a second contact located on a corresponding first edge of the second polymer tape element;
   a second electrical connection connecting a third contact located on the second edge of the first polymer tape element to a fourth contact located on a corresponding second edge of the second polymer tape element; and
   at least one microelectronic element mounted to at least one of the polymer tape elements.

9. The microelectronic circuit package according to claim 8, further comprising an aperture extending through at least one of the polymer tape elements, the aperture providing a path for wire bonding one of the first contact and second contact to a further contact.

10. The microelectronic circuit package of claim 8, wherein the electrical connection is via a wire bond.

* * * * *